(12) United States Patent
Jackson

(10) Patent No.: US 8,362,845 B2
(45) Date of Patent: Jan. 29, 2013

(54) METHOD AND APPARATUS TO IMPROVE PERFORMANCE OF GPSDO'S AND OTHER OSCILLATORS

(75) Inventor: Gregor Said Jackson, Campbell, CA (US)

(73) Assignee: Jackson Labs Technologies Inc., Los Gatos, CA (US)

(*) Notice: Subject to any disclaimer, the term of this patent is extended or adjusted under 35 U.S.C. 154(b) by 0 days.

(21) Appl. No.: 12/963,629

(22) Filed: Dec. 9, 2010

(65) Prior Publication Data

US 2011/0298548 A1  Dec. 8, 2011

Related U.S. Application Data

(60) Provisional application No. 61/285,101, filed on Dec. 9, 2009.

(51) Int. Cl.
*H03B 5/30* (2006.01)
*H03L 7/085* (2006.01)

(52) U.S. Cl. .............. 331/158; 331/1 R; 331/18; 331/14
(58) Field of Classification Search .................. 331/1 R, 331/14, 18, 44, 35, 34, 36 C, 116 R, 116 FE, 331/158
See application file for complete search history.

(56) References Cited

U.S. PATENT DOCUMENTS

| 6,472,943 B1* | 10/2002 | Soong et al. ............... 331/44 |
| 6,545,550 B1* | 4/2003 | Frerking ..................... 331/44 |
| 6,711,230 B1* | 3/2004 | Nicholls et al. ............ 375/376 |
| 2012/0042192 A1* | 2/2012 | Rae et al. .................... 713/500 |

* cited by examiner

*Primary Examiner* — Ryan Johnson
(74) *Attorney, Agent, or Firm* — Mark Gonzales

(57) ABSTRACT

In one embodiment, the present invention includes a method of correcting the frequency of a crystal oscillator. The method includes establishing an operating baseline for the crystal oscillator using a frequency reference, storing information in memory, and adjusting the frequency according to the information. The information corresponds to the operating baseline. Adjusting the frequency occurs in response to a power-on event and the absence of the frequency reference.

20 Claims, 5 Drawing Sheets

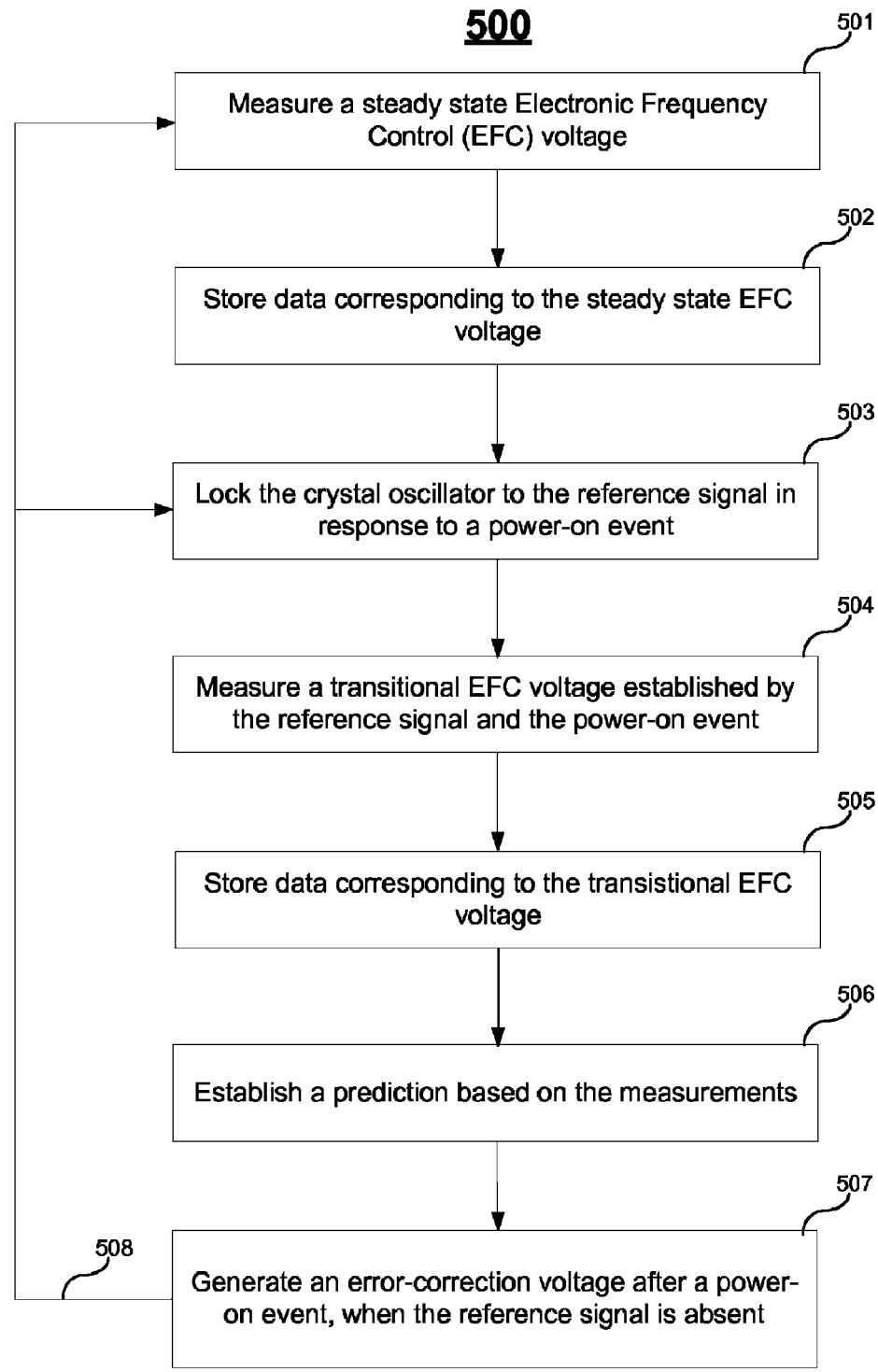

METHOD AND APPARATUS TO IMPROVE PERFORMANCE OF GPSDO'S AND OTHER OSCILLATORS

CROSS REFERENCE TO RELATED APPLICATIONS

The present application claims priority to U.S. Provisional Application No. 61/285,101 titled "Method and Apparatus to Improve Performance of GPSDO's and other Oscillators", filed Dec. 9, 2009.

BACKGROUND

The present invention relates to the performance of crystal oscillators, and in particular, to a method and apparatus to improve performance of Global Positioning System Disciplined Oscillators (GPSDO's) and other oscillators.

Crystal Oscillators have significant drift right after power-on; This drift is commonly called retrace. This drift is asymptotic in nature and most prevalent during the first 30-45 minutes after power on. This drift can cause machinery such as communication equipment to malfunction due to phase or frequency errors attributed to this drift.

SUMMARY

Embodiments of the present invention improve the performance of crystal oscillators during initial power up. In one embodiment the present invention includes a method of correcting a frequency of a crystal oscillator. The method includes establishing an operating baseline, storing information, and adjusting the frequency. The establishing includes establishing an operating baseline for the crystal oscillator using a frequency reference. The storing includes storing information in memory; The information corresponds to the operating baseline. The adjusting includes adjusting the frequency according to the information, thereby correcting the frequency of the crystal oscillator. The adjusting occurs in response to a power-on event and the absence of the frequency reference.

In one embodiment, the establishing of the operating baseline includes measuring a first value of a frequency control signal in response to a second power-on event, and measuring a second value of the frequency control signal after at least thirty minutes of operation. The first and second values occur in response to the external frequency reference.

In another embodiment, the method further comprises calculating error correction to provide the information, and applying an error signal to the crystal oscillator. The error signal corresponds to the error correction.

The present invention also includes a method of calibrating a frequency of a crystal oscillator. The method includes measuring, storing, locking, establishing, and generating. The measuring includes measuring a first Electronic Frequency Control (EFC) voltage established by locking the crystal oscillator to a frequency reference signal and the first EFC voltage obtaining a steady state value. The storing includes storing data corresponding to the first EFC voltage in a memory. The locking includes locking the crystal oscillator to the reference signal in response to a first power-on event. The measuring includes measuring a second EFC voltage established by the reference signal and the first power-on event. The establishing includes establishing a prediction of a change of frequency during the first hours of operation based on the first and second EFC voltages. The generating includes generating an error-correction voltage during at least a portion of the first hours of operation, thereby reducing the frequency errors caused by crystal retrace. The generating occurs in response to a second power-on event occurring in conjunction with the absence of the frequency reference signal. The error-correction voltage is based on the prediction.

In one embodiment, the method further includes determining the correction magnitude between the first and the second EFC voltages with a correction amount specifically calibrated to the crystal oscillator as measured in a calibration power-on cycling event.

The following detailed description and accompanying drawings provide a better understanding of the nature and advantages of the present invention.

BRIEF DESCRIPTION OF THE DRAWINGS

FIG. 5 illustrates a method according to another embodiment of the present invention.

DETAILED DESCRIPTION

Described herein are techniques for method and apparatus to improve performance of GPSDO's and other oscillators. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

GPSDO's and other oscillators typically use Quartz Crystals in an oven enclosure called Ovenized Crystal Oscillators (OCXO's). These OCXO's have an electronic control voltage input to establish the operating frequency of the Quartz Crystal. This operating voltage typically allows a fine-frequency adjustment of 1 ppm to 10 ppm of the operating frequency of the OCXO. Software-prediction may be used to adjust this operating voltage (commonly called Electronic Frequency Control (EFC) voltage).

Figure 1:
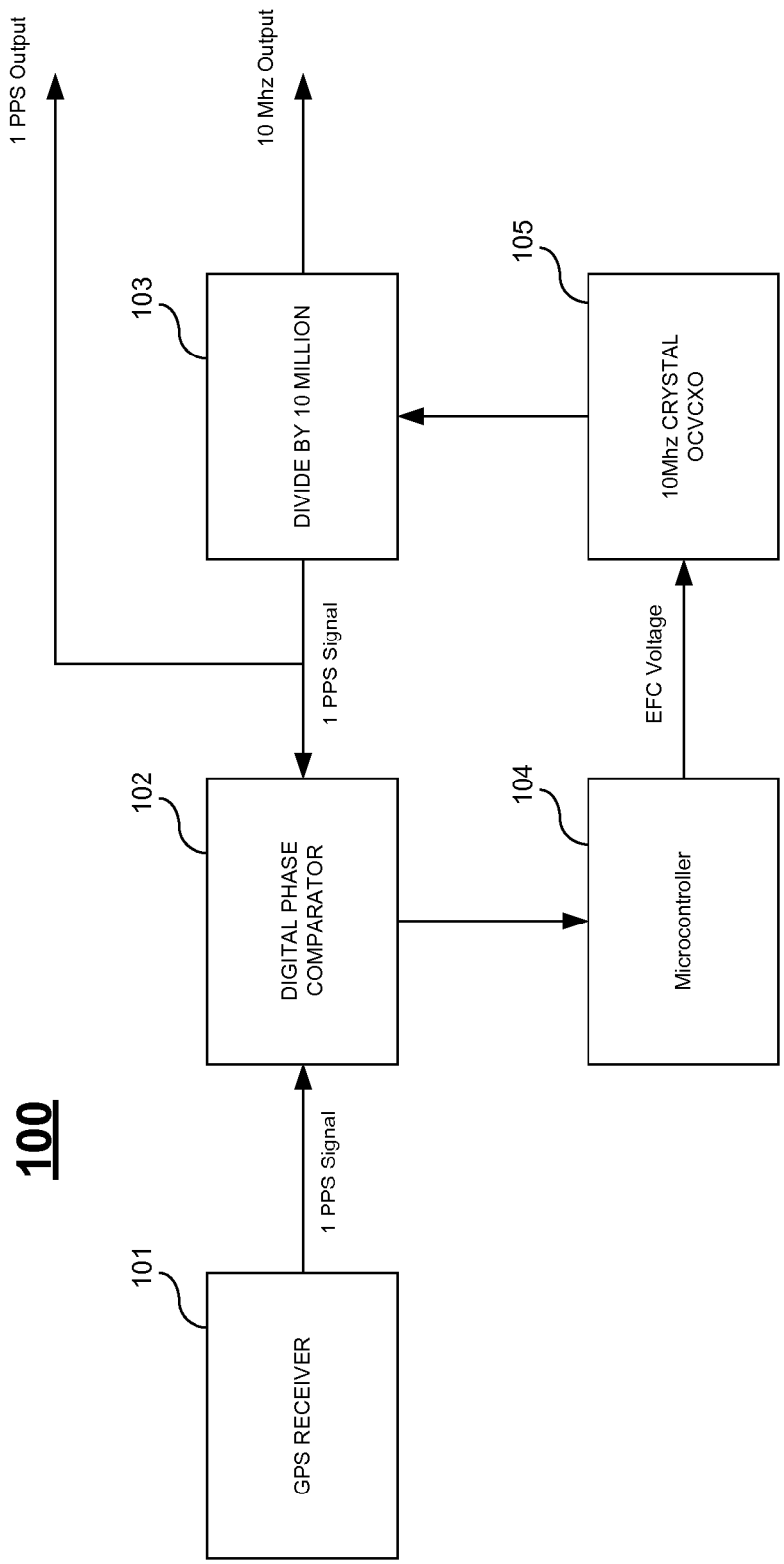
FIG. 1 illustrates a GPDSO system.

FIG. 1 illustrates a GPDSO system 100. GPDSO system 100 includes GPS receiver 101, digital phase comparator 102, divider 103, microcontroller 104, and crystal oscillator 105. During operation digital phase comparator 102 receives a 1 PPS signal from GPS receiver 101 and a 1 PPS signal from divider 103. Digital phase comparator 102 provides a difference signal to microcontroller 104. Microcontroller 104 provides an EFC voltage to crystal oscillator 105 corresponding to the difference signal. Divider 103 receives the signal from crystal oscillator 105 and divides the signal by 10 million to produce a modified 1 PPS signal to digital phase comparator 102. Once this loop has settled the 1 PPS signals will match and divider 105 will provide a 1 PPS output signal and a 10 Mhz output signal. The GPSDO system 100 depends on an external reference signal from GPS receiver 101 in order to provide an accurate 1 PPS signal output and 10 Mhz signal output.

Figure 2:
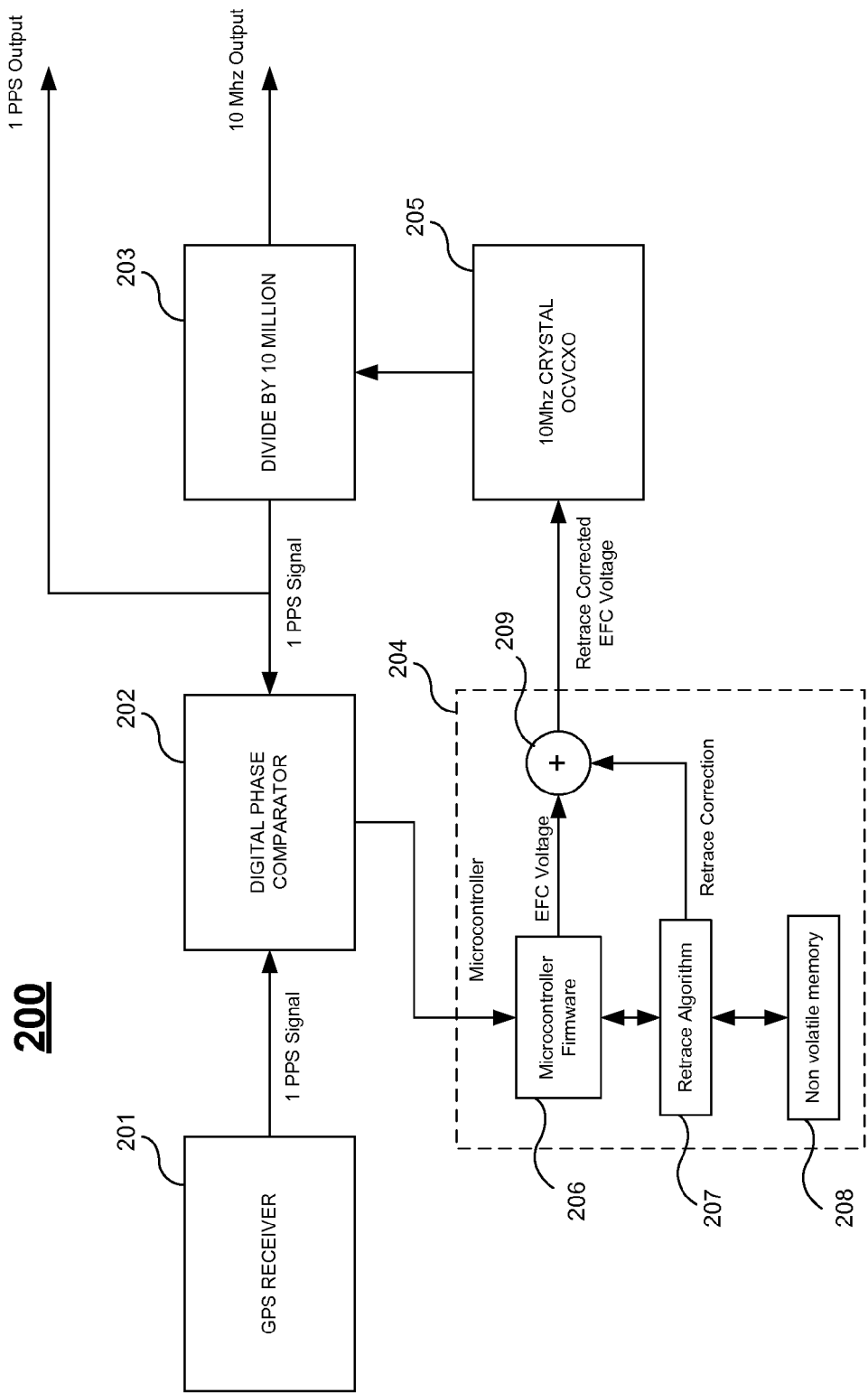
FIG. 2 illustrates a GPDSO system according to one embodiment of the present invention.

FIG. 2 illustrates a GPDSO system 200 according to one embodiment of the present invention. GPDSO system 200 includes GPS receiver 201, digital phase comparator 202, divider 203, and crystal oscillator 205 which operate similar to GPS receiver 101, digital phase comparator 102, divider 103, and crystal oscillator 105 of GPSDO system 100 of FIG. 1. In this embodiment, microcontroller 204 includes microcontroller firmware 206, retrace algorithm 207, non-volatile memory 208, and adder 209. Microcontroller 204 saves long-term operating baseline information regarding the steady state value of the EFC voltage and uses this information along with the instantaneous EFC voltage to provide a retrace corrected EFC voltage.

In this embodiment, long-term operating baseline information for the crystal oscillator 205 is stored in non-volatile memory 208. Microcontroller firmware 206 may measure the EFC voltage upon power-on and correct the crystal frequency. If the GPS receiver 201 is available the 1 PPS signal from the GPS receiver 201 may be used to correct the 10 Mhz output signal. If the GPS 1 PPS signal is not available, the information from the non-volatile memory 208 may be used in correcting the crystal frequency. Retrace algorithm 207 may calculate a statistical behavior model of the crystal based on the stored information and newly established parameters of operation, and then apply to the crystal oscillator 205 a retrace corrected EFC voltage/force to compensate for the retrace error. The retrace corrected EFC voltage/force may be provided by adder 209 and be the sum of the EFC voltage and a retrace correction based on the statistical behavior model of the crystal.

In one embodiment, a software algorithm is used to compare previous crystal behavior to present performance of the crystal. The previous crystal behavior may be based on a long-term calibration run which may be stored in non-volatile memory. The algorithm may interpolate an operating point (e.g. EFC voltage) between the instantaneous operating point of the EFC voltage of the crystal and the previously stored long-term calibration EFC voltage values from memory. The instantaneous operating parameters may be measured against an external reference (e.g. GPS, or other external sources). The algorithm may use the difference between the present EFC voltage and the calibration EFC voltage to adjust the crystal operating frequency via adjustment of the EFC voltage, in an effort to maintain the best possible frequency accuracy on the output of the OCXO. This retrace correction factor may be added to the crystal EFC operating voltage alongside temperature, aging, and g-compensation voltages to keep the crystal vibrating at a nominal frequency. This maintains the operating frequency of typical OCXO's to within +/−50 parts per trillion of its optimal frequency over several days in a typical embodiment of the invention.

The algorithm may calculate the retrace error correction voltage based on a linear interpolation. The algorithm may calculate the retrace error correction voltage based on a better-fitting exponential-decay curve. This correction curve may be calculated by subtracting the present EFC operating voltage (as established shortly after power-on) from the previously established long-term calibration EFC operating voltage, and applying a linear or exponential interpolation between the two EFC voltages. The interpolation may be a slowly varying voltage over time so that after a given time period (usually 30 minutes to 2 hours) the operating voltage of the crystal is closer to the long-term average calibration voltage than the power-on operating EFC voltage. This method may compensate for the change in crystal frequency caused by out-gassing and stress-relief mechanisms on the crystal itself. The retrace error caused by these stress-relief mechanisms may be compensated for by predicting the retrace error in an algorithm and properly adding correction parameters to the crystal via controlling the EFC voltage.

Figure 3:
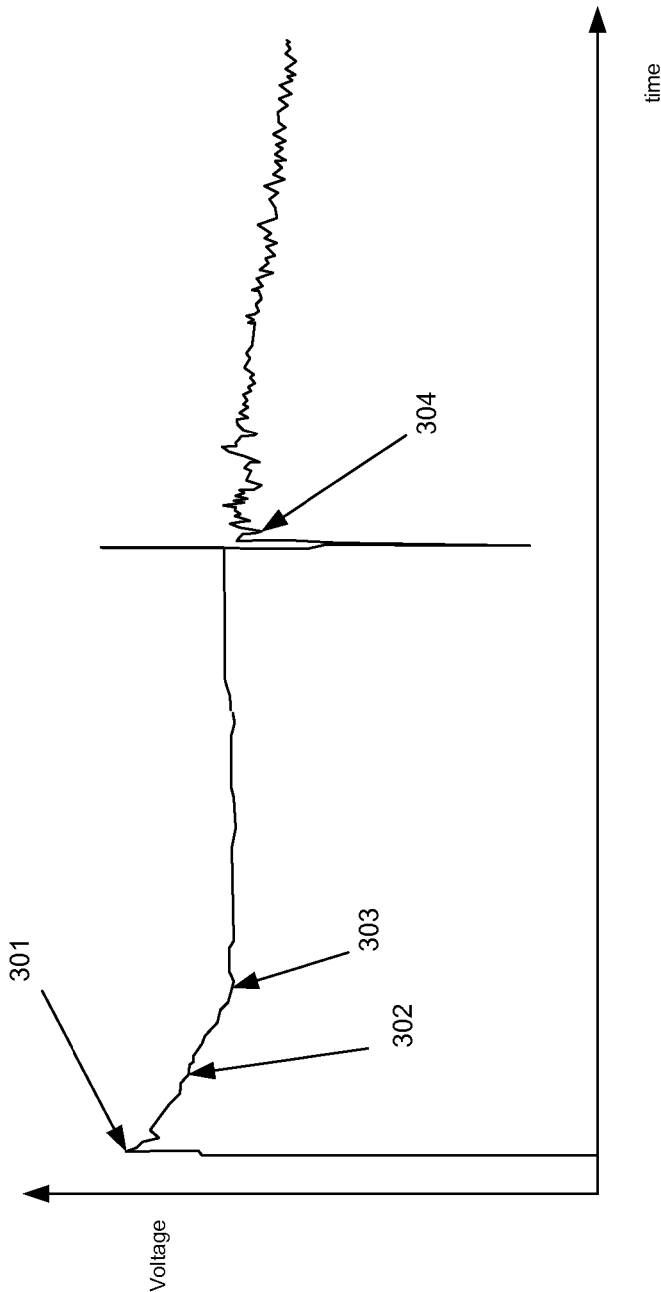
FIG. 3 illustrates a graph depicting an example of a working implementation of the present invention.

FIG. 3 illustrates a graph 300 depicting an example of a working implementation of the present invention. Graph 300 includes an EFC voltage waveform when an external reference (e.g. a GPS receiver) is not available. At point 301, EFC voltage reaches a peak after power-on. At region 302, a linear EFC retrace correction is active such that the frequency of the oscillator may be corrected during the retrace portion of the crystal behavior immediately following power-on. Linear EFC retrace correction ends at point 303. At point 304, the GPS signal is locked after 3 hours without a GPS signal. Note that the predicted EFC voltage is proximate to the EFC voltage established by phase-locking to the GPS 1 PPS signal. Graph 300 of the EFC voltage shows how the retrace corrected EFC voltage converges on the long-term operating baseline of the crystal oscillator, and how the system, in the absence of an external reference, may operate with an improved frequency accuracy given retrace error after power-on.

A linear retrace compensation curve is an approximation of the exponential decay retrace error. Even so, a linear compensation curve may achieve 50% to 100% reduction in error due to retrace in the crystal. Using an exponential curve that is better fitted to the actual crystal retrace behavior (which is always exponential in nature) may further improve performance. Determining the correction magnitude between the long-term-stored EFC voltage and the power-on EFC voltage (as established by locking the crystal to a GPS reference signal) may be done by a best-fit approach (anywhere from 0% to 100% or more correction). Optionally, determining the correction magnitude between the long-term-stored EFC voltage and the power-on EFC voltage may be done with the correction amount specifically calibrated to every crystal as measured in a calibration power-on cycling event. The nature of the crystal retrace is such that any correction already helps improve the performance of the system, and the correction parameters can thus be hard-coded, user-adjusted, or individually calibrated on a per-unit basis to improve upon the performance of the GPSDO/Oscillator upon the first hours after power on.

In one embodiment, a reference signal, such as a GPS 1 PPS signal, is compared to the output of a crystal oscillator which may reside in an oven (e.g. OCXO) to keep the crystal temperature stable. The crystal frequency may be controlled by adjusting an EFC voltage which will act on a varactor diode to increase or decrease the crystal frequency depending on the EFC voltage. In a GPSDO, this voltage may be controlled by comparing to a GPS signal, calculating an error signal, and applying this error signal to the crystal. In the absence of GPS signals, this voltage may be controlled by applying a temperature and aging correction (typically as linear factors) to this EFC voltage to decrease the crystal frequency error as much as possible. Additionally, a retrace-correction term may be added to the EFC voltage during the first hours of operation to compensate for the exponential error term called "crystal retrace." This error term is most significant right after power-on of the unit, and usually dissipates completely 3-4 hours after power on.

In one embodiment, a microprocessor may control the generation of the error term of the EFC voltage corresponding to a long-term-calibration data in non-volatile memory. The microprocessor may compare this long-term-calibration data to the data corresponding to the instantaneous EFC voltage after power on (as established by locking the crystal to the GPS reference over the first say 5-15 minutes after power-on). The microprocessor may add either a linear or exponential error correction term to the EFC voltage of the crystal. This may improve the frequency performance of the entire unit especially during the first hours of operation, and if the external reference (e.g. GPS) is lost shortly after power-on. In the absence of an external reference signal such as a GPS signal, the unit may rely on previously established retrace error correction parameters from non-volatile memory, and therefore, improve the crystal performance without the need for any external references to compare against.

In one embodiment, the method includes measuring the crystal EFC voltage as established by locking the crystal to a reference such as GPS 1 PPS signals over very long operating times (50-70 or more hours of continuous operation), and storing this EFC voltage value in non-volatile memory. Upon power on, a new voltage will be established by locking the crystal to the reference (GPS 1 PPS etc). This voltage may be significantly different from the long-term average voltage due to an effect called crystal retrace, which may cause a change in crystal frequency by up to 5 or more parts per billion. The algorithm may calculate the difference between the power-on EFC voltage and the long-term voltage, and then establish a prediction of the change of frequency during the first hours of operation based on these two voltages. Based on this prediction, an error-correction voltage may be applied during the first hours of operation which may significantly reduce the effect of, or completely compensate the effect of crystal retrace. This prediction or the error correction voltage values may be stored in non-volatile memory to be used as a base-point for compensation during subsequent power-on cycles in case an external reference is not available. Adding a crystal retrace error-correction voltage over time to the EFC crystal control voltage reduces the effect of crystal retrace. Typically these retrace error-correction voltage values are in the range of 3 to 5 millivolts, and are applied for a period of 30-90 minutes after power-on. By applying this retrace error-correction voltage to compensate for crystal retrace errors due to out-gassing or stress relief of the crystal, this embodiment is able to improve the performance of a typical GPSDO from 14-16 microseconds drift over 3 hours after power-on to below 6 microseconds typically when using 45 minutes of correction after power-on. A factor of 2× to 3× improvement in performance may be achievable which may not otherwise be achievable with conventional methods. For a typical 10 MHz GPSDO, this calculates to reducing the frequency error from more than 1.5 ppb to less than 0.6 ppb over a 3 hour measurement period.

In one embodiment, the method may be performed by a computer or microcontroller by operating the crystal at its nominal frequency under the control of a PLL loop algorithm by locking it to an external reference such as a GPS 1 PPS signal. After many hours (typically days) of constantly locked performance, the control voltage (EFC voltage) magnitude is stored in non-volatile memory of the computer/microcontroller for later access. This works due to the fact that the crystal will very likely retrace back to this long-term-calibrated EFC operating voltage, and thus this voltage may act as a long-term calibration parameter. After a power-off period, the crystal may have a different frequency right after power-on. This frequency difference could be up to 20 ppb or more. The GPSDO will immediately correct for this frequency error using phase locked loop techniques, by comparing the crystal frequency again to an external reference such as GPS 1 PPS. Thus the computer/microcontroller can establish the difference (error) between long-term-stored calibration parameters (long-term EFC voltage) and the new EFC voltage required to operate the crystal at nominal frequency right after power-on. By establishing this difference in frequency and thus EFC voltage, the computer/microcontroller can predict the retrace behavior of the crystal. The crystal EFC voltage will vary between the instantaneous EFC voltage and the long-term EFC voltage in an exponential manner; This is due to the crystal retrace phenomenon. The computer/microcontroller can now apply a predicted error-correction voltage to the EFC voltage, and thus partially or completely compensate for this retrace error by simply predicting it, and adding an error-compensating voltage to the EFC voltage via a DAC.

In another embodiment, calibration parameters and firmware algorithms may be added to existing oscillator or GPSDO hardware. Another embodiment includes a microcontroller based retrace-correction mechanism designed-in to off-the-shelf crystal oscillators by adding EFC frequency control to the crystal using a microcontroller, DAC, and varactor diode.

In yet another embodiment, the retrace control method may be integrated into the other crystal oscillator frequency control algorithms. In another embodiment, the retrace control method may be added in analog fashion to the EFC control voltage that works on the varactor diode, a second varactor diode may be added to control the crystal frequency, or the frequency error correction may be applied by varying the crystal operating temperature. Varying the crystal operating temperature may have an immediate effect on the crystal frequency by varying the operating point of the crystal. In one embodiment, crystals that only have mechanical adjustments may have added an EFC control mechanism to the crystal to apply this crystal retrace error correction. In another embodiment, a mechanical servo mechanism can be used to establish frequency control.

In one embodiment, the method may be integrated into oscillator—specifically oscillators used on GPSDO's (GPS Disciplined Oscillators). A performance test may include turning on the GPSDO for a short period of time (say 10 min to 15 minutes) to lock to an external reference (e.g. GPS), removing the external reference, and then monitoring how the unit's output phase and frequency varies over the next 2-4 hours of operation. During such a test, firmware was loaded on a microprocessor driving an off-the-shelf OCXO, and the drift error improved from more than 14 microseconds to below 6 microseconds, which is equivalent to reducing the average frequency error of the oscillator from more than 1.5 ppb to less than 0.6 ppb over the duration of the test.

Embodiments of the invention may be used in a chemical/physical process that experiences rapid change in operating parameters shortly after power-on, or after applying heat. This may be accomplished by compensating for the physical/chemical changes happening rapidly after power-on and subsiding in an exponential manner to (or close to) a previously known reference value/operating point. The physical/chemical changes occurring after power-on may behave similarly to the frequency behavior of a crystal after power-on.

In one embodiment, software is used for retrace compensation during the first 30-60 minutes of operation in a GPSDO reference. This may improve the performance of a GPSDO/Oscillator by reducing the retrace error by 50% to 100%.

In one embodiment of the invention, an electronic circuit measures the retrace magnitude, and applies a mathematical approximation error correction to the crystal during the first 30 minutes to several hours of operation after power on. This new method significantly reduces the frequency and phase error of GPSDO's/Oscillators during the first hours of operation, with significant emphasis on the retrace error magnitude during the first 30 minutes to 60 minutes of operation after power-on.

In one particular implementation of a GPSDO, crystal based GPSDO exhibits a reduced drift from over 14 microseconds over the first 3 hours of operation, to below 4 microseconds.

Figure 4:
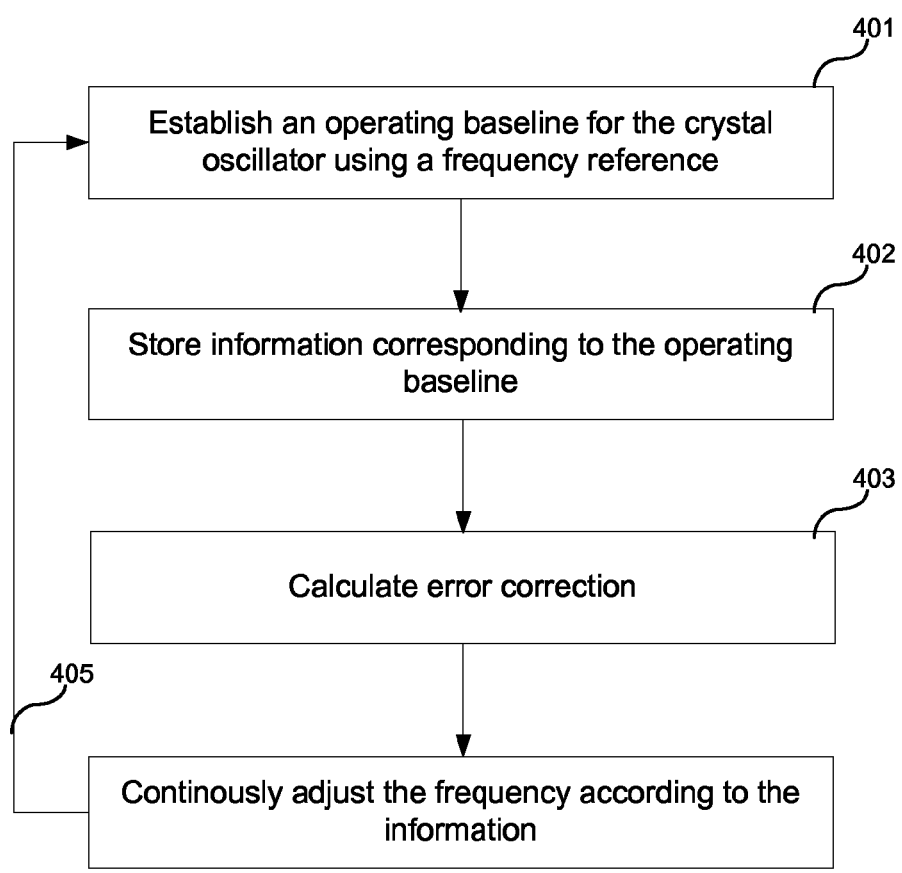
FIG. 4 illustrates a method according to one embodiment of the present invention.

FIG. 4 illustrates a method 400 according to one embodiment of the present invention. Method 400 corrects a frequency of a crystal oscillator.

At 401, establish an operating baseline for said crystal oscillator using a frequency reference. The operating baseline may be measured when a controller is coupled in a control loop using a frequency reference, as described above. With the frequency reference, the controller may make measurements of the characteristic of a control signal used to adjust the crystal oscillator. These measurements may include at least one measurement occurring in response to a power-on event. This event may be when the crystal is exhibiting a large amount of frequency error associated with retrace. Other measurements may include a measurement at a steady state condition of the control signal. The actual time for the crystal to reach a steady state may vary between crystal oscillators. At least thirty minutes may be required before making a measurement of the steady state value. In practice it may be more than several hours before such a measurement may be made accurately.

At 402, store information corresponding to the operating baseline. The information may include the measurement values stored in non-volatile memory as described above.

At 403, calculate error correction to provide the information corresponding to the operating baseline. Error correction may include calculating a curve as described above. At least one measurement of the control signal (when no frequency reference is available) may be used to determine the error correction. The error correction may include factors as described above. Also, the error correction may include interpolation as described above.

At 404, Adjust the frequency of the crystal oscillator according to the information. The adjusting may occur in response to a power-on event and the absence of the frequency reference. An error signal corresponding to error correction may be used to adjust the frequency, and a DAC may be used to output a control signal which continuously adjusts the frequency. The adjustment may occur during a portion of time (e.g. during the crystal retrace behavior as described above), and after this time the control signal may remain stable. The adjustment may compensate for errors in the frequency.

At 405, the method may repeat. For example, if a GPS signal reference becomes available after 50 hours of operation, a steady state value may be re-measured. Also, for example, on another power-on event, the GPS may be available and the control loop may become locked. Once again, the system may re-measure points to replace the previous baseline. The comparison of the newly measured baseline points may take into account other factors such as temperature, g-compensation, etc.

FIG. 5 illustrates a method 500 according to another embodiment of the present invention. Method 500 measures a control voltage to establish a prediction of frequency exhibiting crystal retrace behavior.

At 501, measure a first Electronic Frequency Control (EFC) voltage established by locking the crystal oscillator to a frequency reference signal and the first EFC voltage obtaining a steady state value. A steady state value may be calculated from an average of several measurements taken over several hours of operation.

At 502, store data corresponding to the first EFC voltage in a memory.

At 503, lock the crystal oscillator to the frequency reference signal in response to a power-on event.

At 504, measure a transitional EFC voltage established by the frequency reference signal and the power-on event. During this period of time the crystal oscillator may be experiencing retrace errors, and measuring points over this time period allows for an estimation of the magnitude and timing of crystal retrace errors. The measuring includes at least one point during this period which has retrace errors.

At 505, store data corresponding to the transitional EFC voltage.

At 506, establish a prediction based on the measurements of 501 and 504. The prediction may be based on curves, factors, interpolation, or any combination of the preceding.

At 507, generate an error-correction voltage after a power-on event, when the reference signal is absent. For example, a GPS signal may be unavailable due to interference or shielding, and the error-correction voltage may be used to keep the crystal oscillator frequency more accurate as described above.

At 508, the method may repeat when the frequency reference is once again available. In one instance, for example, the GPS signal is available at power up and at 503 locks to the signal. In this case, the transitional EFC voltage will be measured again at 504. In another example, the GPS signal in available after several hours of operation using the error-correction voltage. In this case, the steady state measurement may be repeated at 501, after the control loop has locked to the GPS signal.

In another embodiment, the error-correction voltage (or signal) may be used consistently such that the deviation from the GPS signal is kept minimal For example, the error-correction signal may continuously updated to reflect the correct frequency such that the GPS signal when present may lock much quicker in the control loop and the resultant frequency may be more accurate overall.

The above description illustrates various embodiments of the present invention along with examples of how aspects of the present invention may be implemented. The above examples and embodiments should not be deemed to be the only embodiments, and are presented to illustrate the flexibility and advantages of the present invention. Based on the above disclosure, other arrangements, embodiments, implementations and equivalents will be evident to those skilled in the art and may be employed without departing from the spirit and scope of the invention.

What is claimed is:

1. A method of correcting a frequency of a crystal oscillator, the method comprising:
  establishing an operating baseline for said crystal oscillator using a frequency reference;
  storing information in memory, said information corresponding to said operating baseline; and
  adjusting said frequency according to said information, thereby correcting said frequency of said crystal oscillator,
  wherein said adjusting occurs in response to a power-on event and the absence of said frequency reference, and
  wherein the establishing of said operating baseline includes measuring a first value of a frequency control signal in response to a second power-on event, and measuring a second value of the frequency control signal after at least thirty minutes of operation, and wherein said first and second values occur in response to said frequency reference.

2. The method of claim 1 wherein the adjusting occurs during a portion of a crystal retrace behavior immediately following said power-on event.

3. The method of claim 1 further comprising calculating error correction to provide said information, and applying an error signal to said crystal oscillator, said error signal corresponding to said error correction.

4. The method of claim 3 wherein said error correction includes retrace correction factors.

5. The method of claim 4 wherein said error correction includes other factors corresponding to temperature, aging, or g-compensation.

6. The method of claim 3 wherein said error correction uses linear interpolation such that a retrace corrected control signal converges to a steady state value corresponding to a steady state value of frequency.

7. The method of claim 3 wherein said error correction includes calculating a linear compensation curve, said linear compensation curve being at least a portion of said information.

8. The method of claim 3 wherein said error correction includes calculating an exponential compensation curve, said exponential compensation curve being at least a portion of said information.

9. The method of claim 1 wherein the frequency reference is a Global Positioning System (GPS) signal.

10. An electronic circuit comprising:
a controller coupled to a crystal oscillator in a control loop, said control loop establishing an operating baseline for said crystal oscillator using a frequency reference,
wherein said controller includes a memory to store information corresponding to said operating baseline,
wherein said controller adjusts a frequency according to said information, thereby correcting said frequency of said crystal oscillator, and
wherein said adjusting occurs in response to a power-on event and the absence of said frequency reference, and
wherein the controller includes firmware to establish said operating baseline by measuring a first value of a frequency control signal upon a second power-on event, and measuring a second value of the frequency control signal after at least thirty minutes of operation, and wherein said first and second values occur in response to said frequency reference.

11. The electronic circuit of claim 10 wherein the controller includes an adder to apply an error signal to said crystal oscillator, said error signal corresponding to error correction calculated from said information.

12. The electronic circuit of claim 11 wherein said error correction uses linear interpolation such that a retrace corrected control signal converges to a steady state value corresponding to a steady state value of frequency.

13. A method of correcting a frequency of a crystal oscillator, the method comprising:
establishing an operating baseline for said crystal oscillator using a frequency reference;
storing information in memory, said information corresponding to said operating baseline; and
adjusting said frequency according to said information, thereby correcting said frequency of said crystal oscillator,
wherein said adjusting occurs in response to a power-on event and the absence of said frequency reference, and
wherein the adjusting occurs during a portion of a crystal retrace behavior immediately following said power-on event.

14. The method of claim 13 wherein the establishing of said operating baseline includes measuring a first value of a frequency control signal in response to a second power-on event, and measuring a second value of the frequency control signal after at least thirty minutes of operation, and wherein said first and second values occur in response to said external frequency reference.

15. The method of claim 13 further comprising calculating error correction to provide said information, and applying an error signal to said crystal oscillator, said error signal corresponding to said error correction.

16. The method of claim 15 wherein said error correction includes retrace correction factors.

17. The method of claim 16 wherein said error correction includes other factors corresponding to temperature, aging, or g-compensation.

18. The method of claim 15 wherein said error correction uses linear interpolation such that a retrace corrected control signal converges to a steady state value corresponding to a steady state value of frequency.

19. The method of claim 15 wherein said error correction includes calculating a linear compensation curve, said linear compensation curve being at least a portion of said information.

20. The method of claim 15 wherein said error correction includes calculating an exponential compensation curve, said exponential compensation curve being at least a portion of said information.

* * * * *